(12) United States Patent
Kurosaka et al.

(10) Patent No.: US 6,270,575 B1
(45) Date of Patent: Aug. 7, 2001

(54) APPARATUS AND A METHOD OF MANUFACTURING A CRYSTAL

(75) Inventors: Shoei Kurosaka; Makoto Kamogawa; Nobuyuki Hukuda; Junsuke Tomioka, all of Hiratuska (JP)

(73) Assignee: Komatsu Electronic Metals Co., Ltd., Kanagawa (JP)

(*) Notice: Subject to any disclaimer, the term of this patent is extended or adjusted under 35 U.S.C. 154(b) by 0 days.

(21) Appl. No.: 09/336,906

(22) Filed: Jun. 21, 1999

(30) Foreign Application Priority Data

Jun. 19, 1998 (JP) .................................................. 10-189766

(51) Int. Cl.[7] .................................................. C30B 35/00
(52) U.S. Cl. .............................. 117/208; 117/14; 117/15; 117/911
(58) Field of Search ................................ 117/14, 15, 208, 117/911

(56) References Cited

U.S. PATENT DOCUMENTS

| 5,582,642 | * | 12/1996 | Korb et al. ............................ | 117/218 |
| 5,948,160 | * | 9/1999 | Sakurada ................................ | 117/14 |

* cited by examiner

Primary Examiner—Felisa Hiteshew
(74) Attorney, Agent, or Firm—Welsh & Katz, Ltd.

(57) ABSTRACT

A value of electric current flowing a neck to a melt is detected, and it is judged that a breaking of the neck occurs when the detected value has been zero, and then a seed is lowered to dip a broken part on the melt. After that the seed is lifted again to restart a pulling operation.

5 Claims, 11 Drawing Sheets

APPARATUS AND A METHOD OF MANUFACTURING A CRYSTAL

BACKGROUND OF THE INVENTION

1. Field of the Invention

This invention relates to an apparatus and a method of manufacturing a crystal, especially an apparatus and a method which are effective to increase the productivity of a crystal.

2. Description of the Prior Art

Czochralski Method (hereinafter referred to as "CZ Method") is known as a manufacturing method of a single crystal of silicon. In the CZ Method, a seed crystal is dipped on the melt which is formed by melting the polycrystalline ingredient, and the seed is lifted to growth the crystal thereunder.

In the CZ Method, crystal defect called "dislocation" is generated at the dipped portion. Such dislocation causes quality deterioration. Therefore, a contraction process called "necking" has been performed to form the neck having predetermined length. As a result, the dislocation can be prevented from entering the crystal.

During the necking, however, the slender neck portion which has been contracted can be broken due to its slender diameter. In this manner, when the break is caused during necking, the necked portion must be melted again, and it is necessary to do the pulling operation all over again.

Additionally, in the case of melting the neck portion, the temperature of the melt must be raise. As a result, a suitable thermal environment for the crystal growth is lost. Therefore, temperature adjustment is necessary when the pulling operation is done over from start.

However, this temperature adjustment is a complicated operation and it takes much time. A smooth crystal manufacturing cannot be achieved by having adjusted the temperature and melted the neck portion whenever the necking fails. This causes the productivity of crystal to reduce.

SUMMARY OF THE INVENTION

The present invention is constructed in order to provide an apparatus and a method which are effective to increase the productivity of a crystal.

To achieve this object, in the present invention, a broken part is dipped on the melt within ten seconds and afterwards pulling operation is restarted. The reason for dipping the broken part within ten seconds is to suppress the temperature difference between the broken part and the melt to be able to exist within the range of the allowance. The permissible level of the temperature difference is determined based on whether the dislocation is generated or not. If the dislocation is not generated when the broken part is dipped on the melt, the pulling operation can be restarted immediately and the productivity of the crystal increases.

DETAILED DESCRIPTION OF THE INVENTION

First of all, we explain the process of the present invention.

As mentioned above, the reason for performing the temperature adjustment is that it is necessary to melt the neck portion into the melt again (hereinafter referred to as "re-melting"). Therefore, it is thought that the productivity of the crystal can be improved if the re-melting of the neck portion can be omitted.

However, it was thought that the above-mentioned re-melting was not able to be omitted by the following reason in the recognition of the past. That is, it was understood among those skilled in the art that the dislocation was introduced when the seed was dipped on the melt, and it was thought that the dislocation was introduced again naturally even if the broken seed was dipped on the melt again.

Breaking generated in the necking operation does not happen at a specific position, and it is a difficult phenomenon to predict. Considering the reproducibility and stability of the necking, trying to contract the neck portion again at the stage of beginning is more excellent than making the complex standard corresponding to all the breaking cases. Therefore, the neck portion was re-melted when breaking was generated.

However, it was found no generation of the dislocation even if the broken part was dipped on the melt under a certain specific condition as a result of many experiments. The result of the experiment by which this is proven is shown below.

Figures 1A, 1B, 1C:
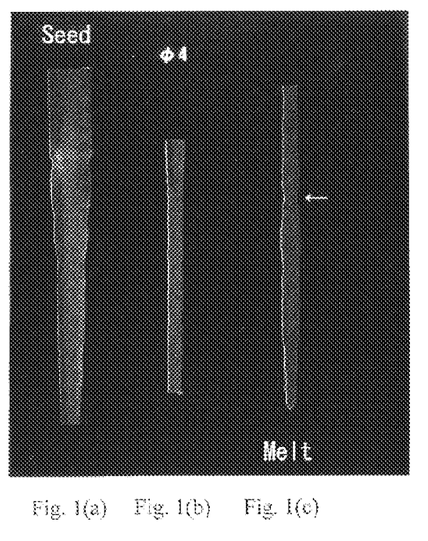
FIGS. 1(a) to 1(c) are X-ray photographs which show the state of disappearing the crystal defect by the necking of 4 mm diameter.

FIGS. 1(a) to 1(c) is a X-ray photograph which shows the state of disappearing the crystal defect by the necking of 4 mm diameter. This photograph is taken by an X-ray Lang method and shows the section of the neck. FIG. 1(a), FIG. 1(b), and FIG. 1(c) are the one part divided one neck into three, the top edge shown in FIG. 1(a) corresponds to the seed side and the bottom edge shown in FIG. 1(c) corresponds to the melt side.

The position shown by the added arrow in FIG. 1(c) is the broken part. The result of experiment shown in this figure was obtained by dipping the broken part on the melt within ten seconds after the neck had been broken, and by pulling from this state again.

A white pattern in FIG. 1(a) shows the process in which the dislocation generated by dipping the seed disappears being transmitted to the neck portion. If referring to FIG. 1(b), it is apparent that the dislocation being generated by dipping the seed disappeared by the contraction of the diameter.

Additionally, if referring to the position indicated by the arrow in FIG. 1(c), it is found that a new dislocation is not generated even if the broken part is dipped and therefore the pulling operation can be performed continuously. The condition that this new dislocation is not generated is within about ten seconds after breaking. For comparison, when the broken part was dipped after 30 seconds had passed since the neck broke, it was confirmed a new dislocation was generated in the broken part.

It is thought that the difference between 30 seconds and ten seconds originates in the temperature difference between the broken part and the melt. That is, in the case of dipping within ten seconds, the temperature difference between the broken part and the melt is still small. On the contrary, in the case of dipping after 30 seconds have passed, the temperature difference between the broken part and the melt will be significant. It is this temperature difference that causes the dislocation.

It should be noted that the above-mentioned fact also shows that the dislocation is not generated by the dip impact but by the temperature difference. That is, if the temperature difference is noted, the necking process can be restarted over and over again. This seems apparent from the following experiment result.

FIGS. 2(a) to 2(e) are X-ray photographs which shows the state of the neck portion when the crystal defect is eliminated by the necking of 4 mm diameter and then the neck portion is enlarged up to 12 mm diameter. The photographs in these figures show one continuous neck as well as FIGS. 1(a) to 1(c).

Figures 2A, 2B, 2C, 2D, 2E:
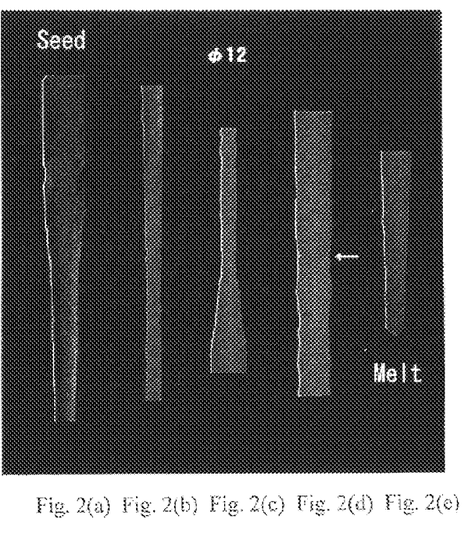
FIGS. 2(a) to 2(e) are X-ray photographs which show the state of the neck portion when the crystal defect is eliminated by the necking of 4 mm diameter and then the neck portion is enlarged up to 12 mm diameter.

The position indicated by the arrow in FIG. 2(d) was a broken part, and the experiment result shown in these figures was obtained by dipping the broken part on the melt within ten seconds after the neck portion had been broken as well as FIGS. 1(a) to 1(c) and by pulling from this state again. As shown in FIG. 2(d), it is found that the dislocation is not generated in the neck portion of 12 mm in diameter as well as those of 4 mm.

It is thought that the cause of the dislocation originates in the temperature difference between the broken part and the melt rather than in the dip impact because the dislocation is not generated in the neck portion of 12 mm in diameter whose dip impact seems greater than those of 4 mm.

A technical meaning of the phenomenon shown by the above-mentioned experiment result is very important. From this phenomenon, the idea "The dislocation is not generated if the broken part is dipped before the temperature difference between the breaking part and the melt becomes significant" is obtained. The present invention tries to achieve the above object based on such an idea.

(The First Mode)

Figure 3:
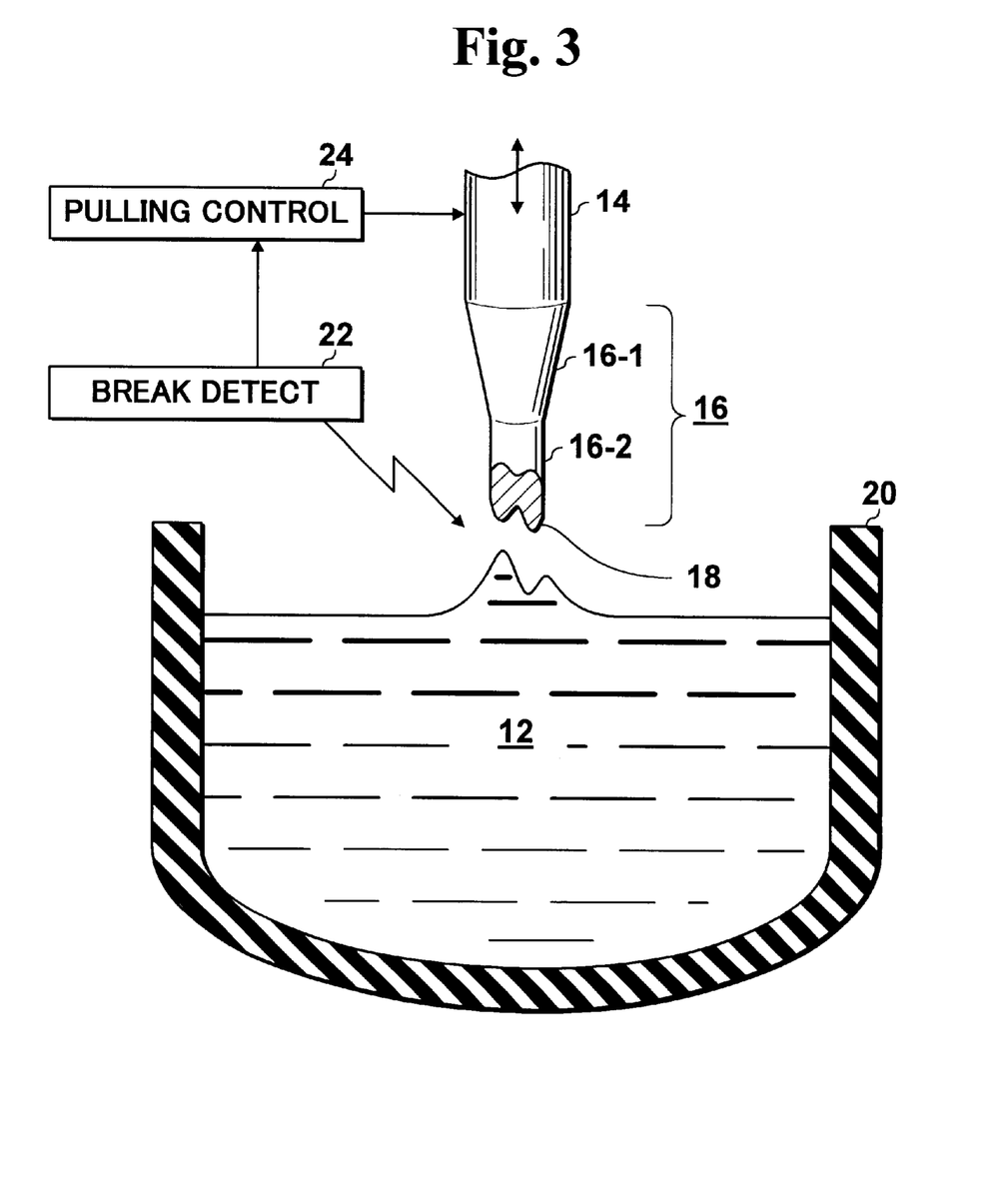
FIG. 3 is a partially sectional view of the first mode of the present invention.

FIG. 3 is a partially sectional view of the first mode of the present invention. Hereafter, the construction of the first mode of the present invention is explained based on this figure.

The breaking detection part 22 is a component which detects the breaking of the neck 16. This breaking detection part 22 always observes the connection of the neck 16 and the melt 12 while necking is being performed, and informs pulling control part 24 of breaking when the neck 16 has broken. The breaking of the neck 16 can be detected by an electrical or an optical technique. This concrete example is explained in the following embodiment.

The neck 16 shown in this figure consists of the taper portion 16-1 whose diameter gradually reduces from the seed 14 and the slender portion 16-2 whose diameter maintains the reduced state. The breaking of the neck 16 can occur either at the taper portion 16-1 or the slender portion 16-2. This figure shows the state that the slender portion 16-2 has broken.

The cause of the breaking may originate the change of the lifting speed of the seed 14 and the change of the temperature of the melt 12 accommodated in the crucible 20. The breaking occurs easily while necking is being performed because the influence by these changes becomes significant. The present invention prevents the temperature difference between the broken part 18 and the melt 12 from being significant by detecting this breaking as soon as possible.

The pulling control part 24 is a component which dips the broken part 18 on the melt 12 responding to the breaking detection by the breaking detection part 22, and then restarts the pulling operation. A time standard from the breaking detection to the dipping of the broken part 18 is within ten seconds as mentioned above. This time limit can prevent the generation of the dislocation.

In a usual pulling apparatus, if the seed is immediately lowered after detecting the breaking, it is enough as time to prevent the generation of the dislocation. Therefore, if the pulling control part 24 has the control algorithm by which the seed is immediately lowered after there is a breaking detection input from the breaking detection part 22, the apparatus which automatically restarts pulling operation can be constructed.

Figure 4:
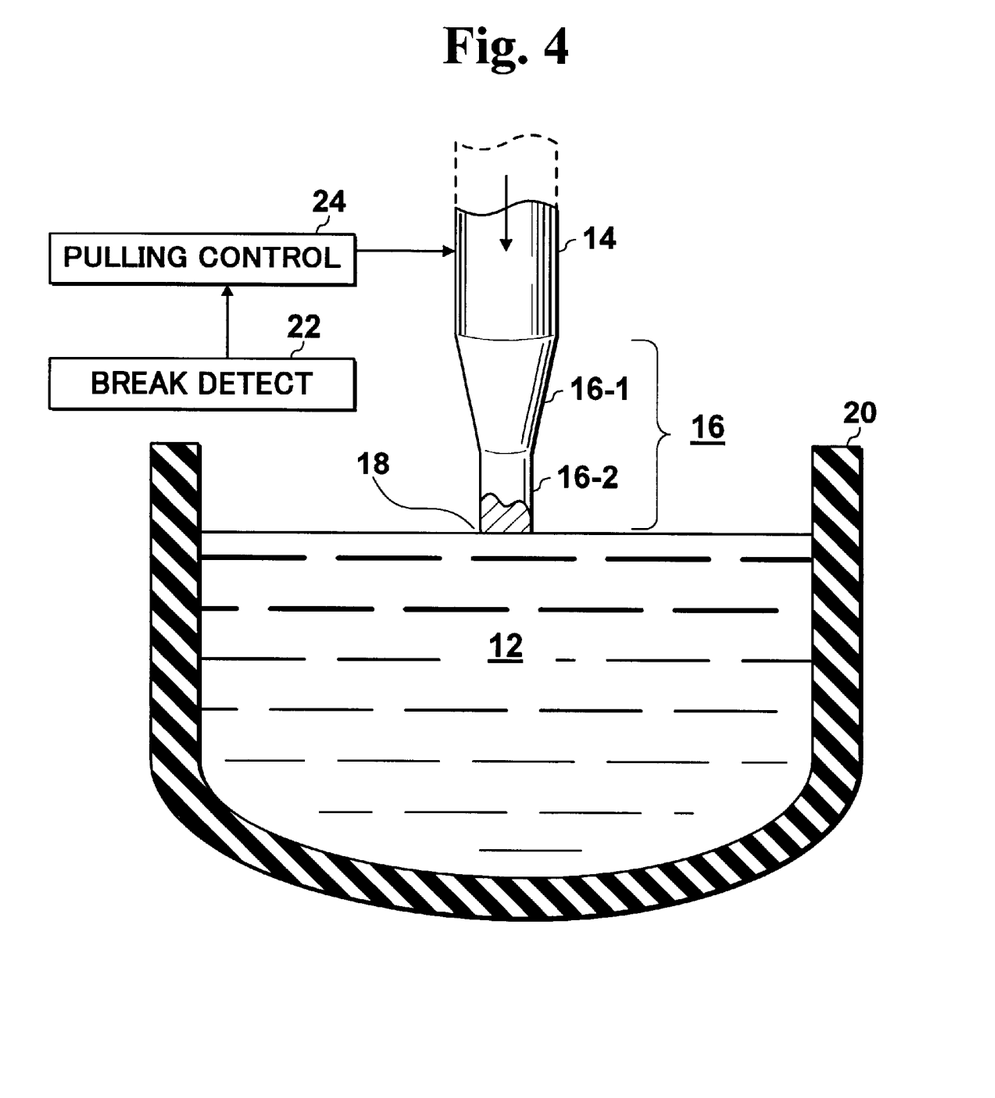
FIG. 4 is a partially sectional view which shows the state of dipping the broken part 18 on the melt 12.

FIG. 4 is a partially sectional view which shows the state of dipping the broken part 18 on the melt 12. As shown in this figure, the pulling control part 24 lowers the seed 14 immediately to dip the broken part 18 on the surface of the melt 12 when the breaking detection signal from the breaking detection part 22 is received.

Figure 5:
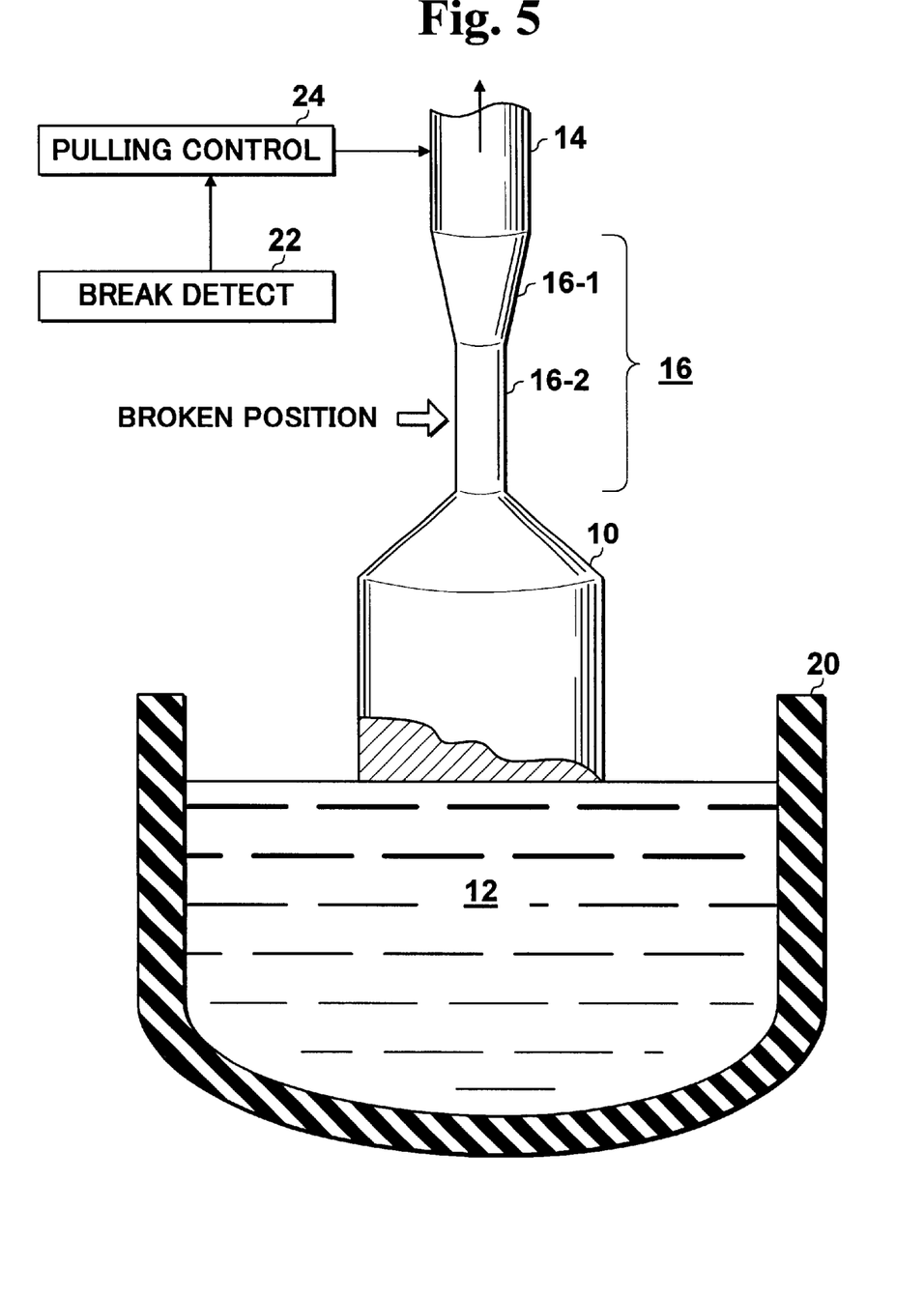
FIG. 5 is a schematic partially sectional view which shows the state of growing the crystal 10 by lifting the seed 14 from the state of FIG. 4.

FIG. 5 is a schematic partially sectional view which shows the state of growing the crystal 10 by lifting the seed 14 from the state of FIG. 4. In this figure, it is a broken position indicated by the arrow which is added to the vicinity of the center of the slender part 16-2. As shown in FIG. 1(c), because a new dislocation due to the dipping of the broken part 18 is not generated at the position which this arrow shows, the pulling operation can be restarted continuously.

(The Second Mode)

The second mode of this invention has a construction in which an additional area is formed beneath the broken part 18 in order to achieve the stability of the diameter and a complete disappearance of the dislocation. Hereafter, the construction of this second mode is explained while referring to the drawings. In the following explanations, the same components in the first mode are referred in the same reference, and their explanation is omitted. In this mode, a part different from the first mode is explained selectively.

Figure 6:
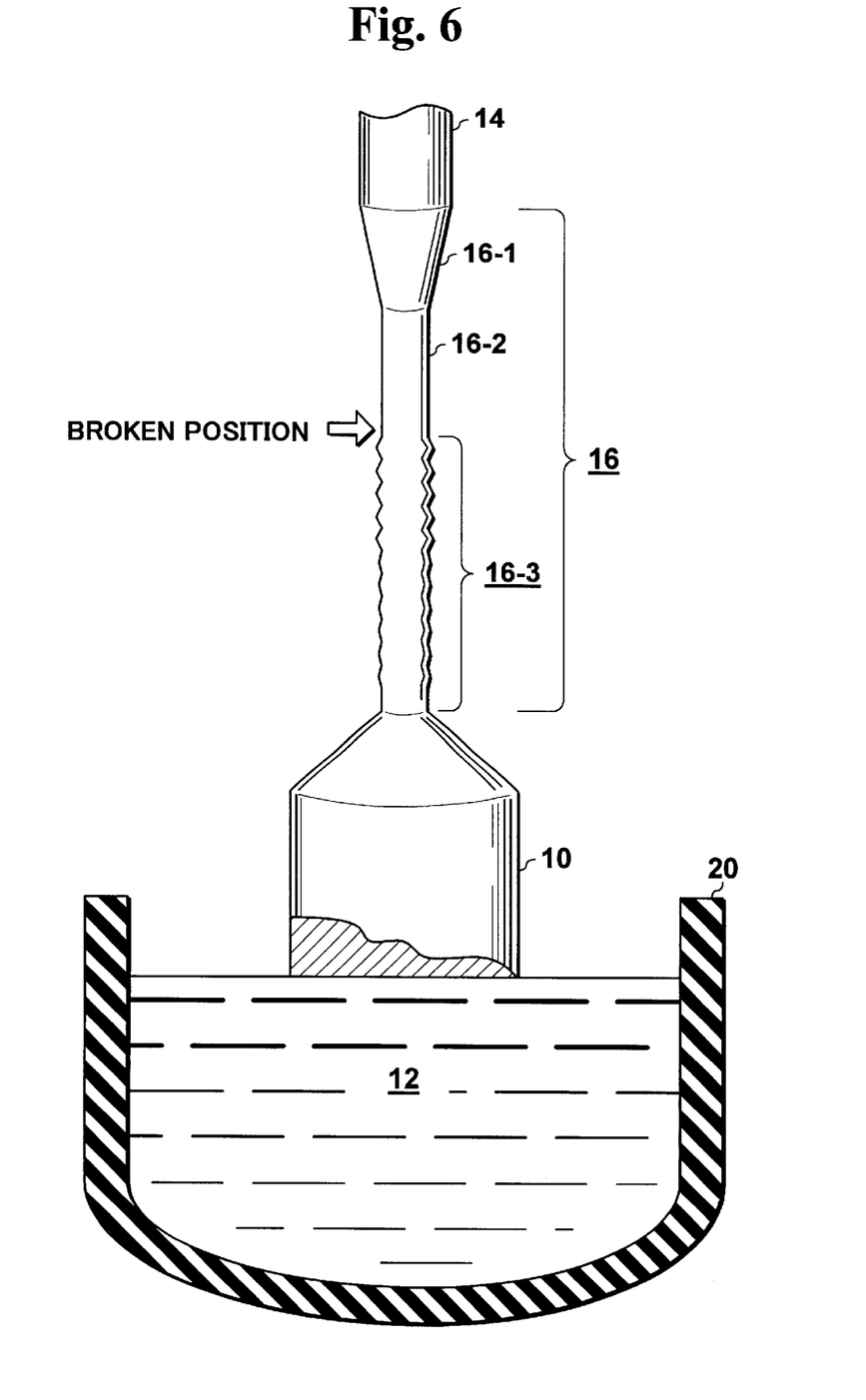
FIG. 6 is a schematic partially sectional view which shows the first example of forming the additional region in accordance with the second mode of the present invention.

FIG. 6 is a schematic partially sectional view which shows the first example of forming the additional region in accordance with the second mode of the present invention. As shown in this figure, the additional region 16-3 is formed beneath the broken part 18 in the second mode of the present invention, the additional region 16-3 shown in this figure is formed aiming at the change absorption of the diameter.

That is, when the breaking occurs during the necking, it is necessary to immediately dip the broken part 18 on the melt 12 and restart the pulling operation. But the diameter of the neck changes even if the pulling operation is restarted because the temperature of the broken part 18 declines and the broken part 18 re-melts when it is dipped on the melt 12.

Therefore, depending on the circumstances, the shoulder expanding of the crystal 10 while the diameter is changing causes the diameter of the crystal 10 to change. Accordingly, the temperature of the melt 12 is adjusted while the additional region 16-3 is formed until its diameter is steady in order to guarantee the growth accuracy of the following crystal 10. This is that the second mode of the present invention is intending.

Moreover, such additional area 16-3 contributes to the disappearance of the dislocation. If it is assumed that the new dislocation is generated when the broken part 18 has dipped on the melt 12, it is necessary to eliminate such new dislocations before the growth of the crystal 10 is restarted. If the additional region 16-3 is formed beneath the broken part 18, even if such a new dislocation can be generated by dipping the broken part 18, this new dislocation can be eliminated in the additional region 16-3.

Figure 7:
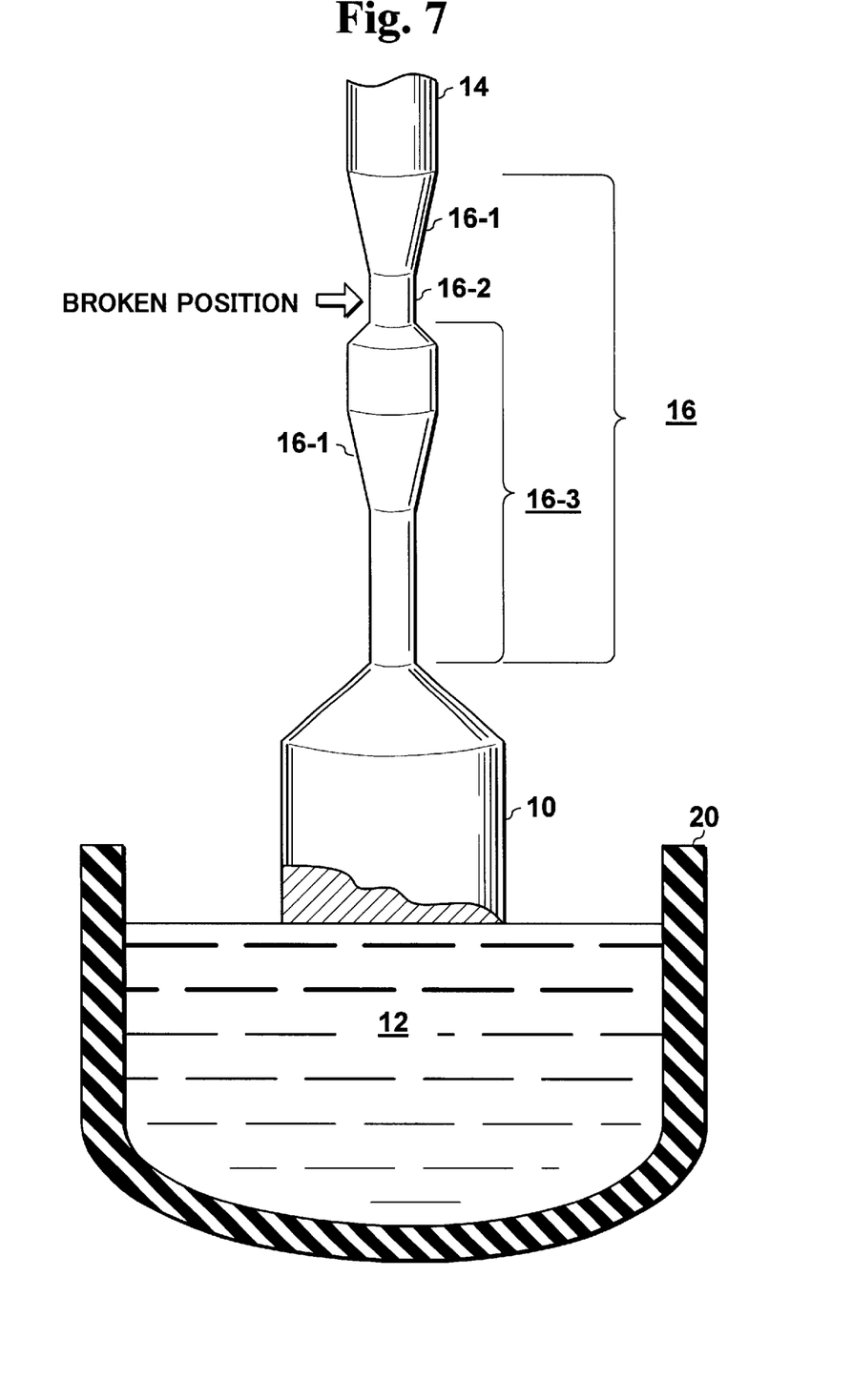
FIG. 7 is a schematic partially sectional view which shows the second example of forming the additional region in accordance with the second mode of the present invention.

FIG. 7 is a schematic partially sectional view which shows the second example of forming the additional region in accordance with the second mode of the present invention. As shown in this figure, in this second example, the neck 16 is enlarged after the broken part 18 is dipped, and the taper portion 16-1 is formed again as the additional region 16-3.

The reason for re-forming the taper portion 16-1 is to eliminate the dislocation actively by forming the taper. The additional region 16-3 contains such shape.

Figure 8:
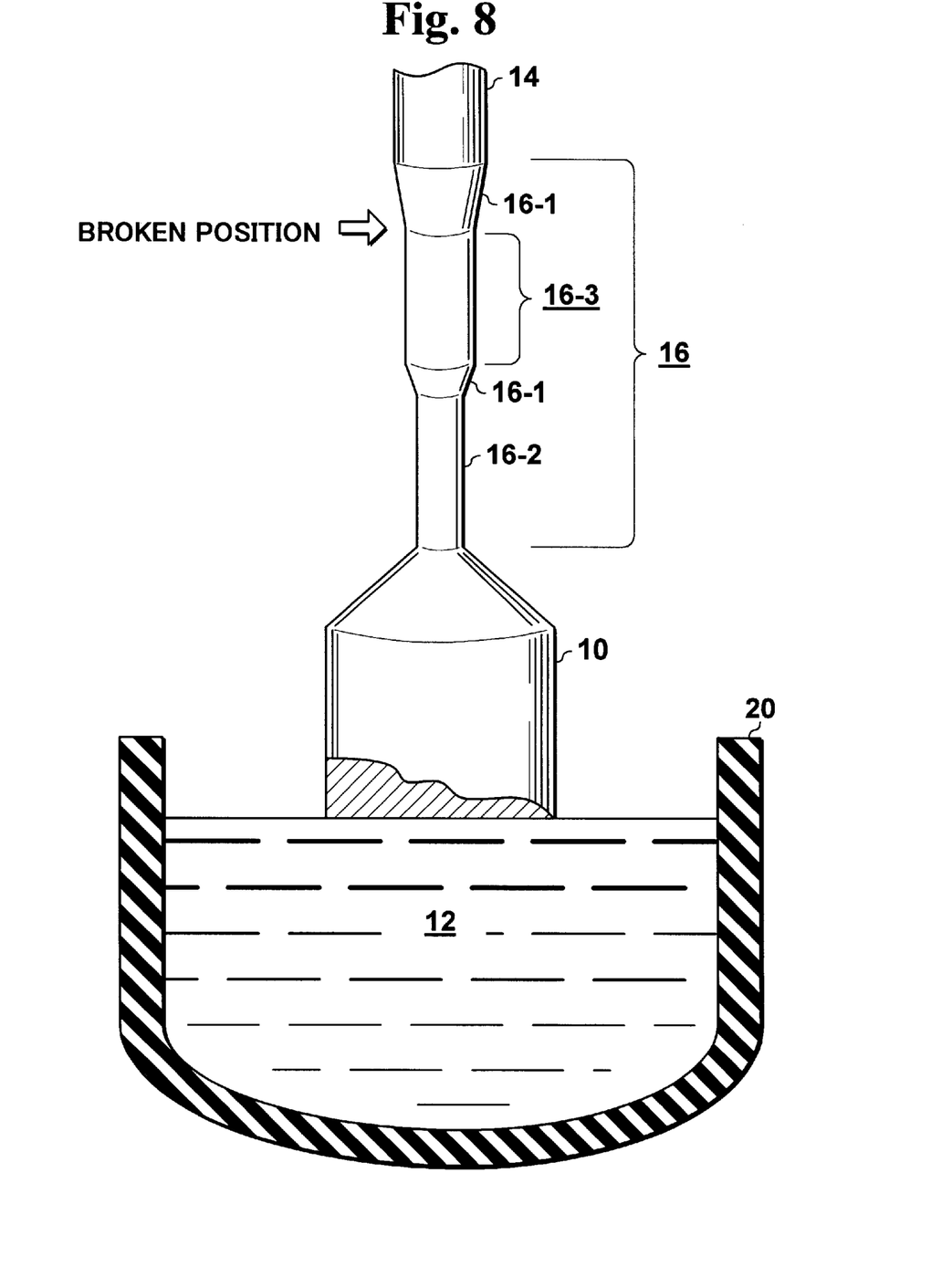
FIG. 8 is a schematic partially sectional view which shows the third example of forming the additional region in accordance with the second mode of the present invention.

FIG. 8 is a schematic partially sectional view which shows the third example of forming the additional region in accordance with the second mode of the present invention, as shown in this figure, this third example is constructed on the assumption that the breaking occurs while the taper portion 16-1 is being formed. That is, when the breaking occurs in the middle of the taper portion 16-1, the additional region 16-3 may be formed beneath the broken part in order to stabilize the diameter and eliminate the dislocation, afterwards remaining part of the taper may be formed.

There are many dislocations within the taper portion 16-1, and diameter control is difficult while the taper is being formed. Therefore, the additional region 16-3 formed in the middle of the taper portion 16-1 is useful.

Figure 9:
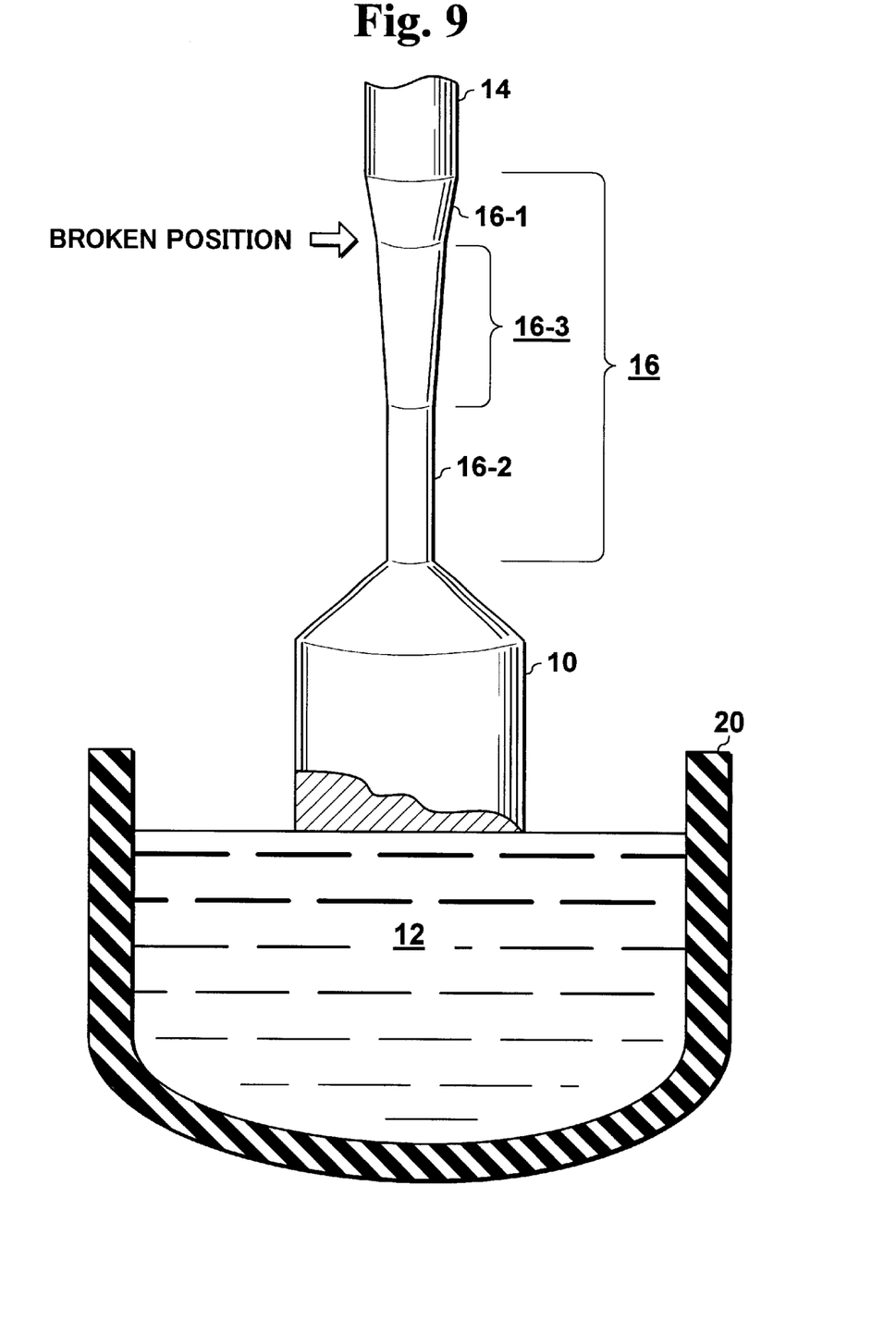
FIG. 9 is a schematic partially sectional view which shows the fourth example of forming the additional region in accordance with the second mode of the present invention.

FIG. 9 is a schematic partially sectional view which shows the fourth example of forming the additional region in accordance with the second mode of the present invention. As shown in this figure, the additional region 16-3 is formed in taper shape. Such a taper shape is also effective to the stability of the diameter and the elimination of the dislocation.

Incidentally, whether the additional region 16-3 as mentioned above should be formed or not may be decided based on the breaking position in the neck 16. For instance, as shown in the FIGS. 1(*a*) to 1(*c*), in the case that the breaking occurs at the position where the dislocation has disappeared and in the case that the diameter change is not so significant, the additional region 16-3 does not have to be formed. On the other hand, in the case that the breaking occurs at the position where the diameter control is difficult, for example the taper portion 16-1, it is preferable to form the additional region 16-3 in order to suppress the diameter change, and then remaining part of the taper portion 16-1 is formed.

DESCRIPTION OF THE PREFERRED EMBODIMENT (Preferred Embodiment)

The above-mentioned technological concept "The dislocation is not generated if the broken part is dipped before the temperature difference between the breaking part and the melt becomes significant" is a very useful idea in the CZ method. Here, the technological concept is embodied in the preferable mode for the industry. Incidentally, the same names and the same references are used to the components which have been explained and the detailed explanations thereof are omitted. Moreover, the preferred embodiment described herein is merely an example of the present invention, therefore this is illustrative and not restrictive.

Figure 10:
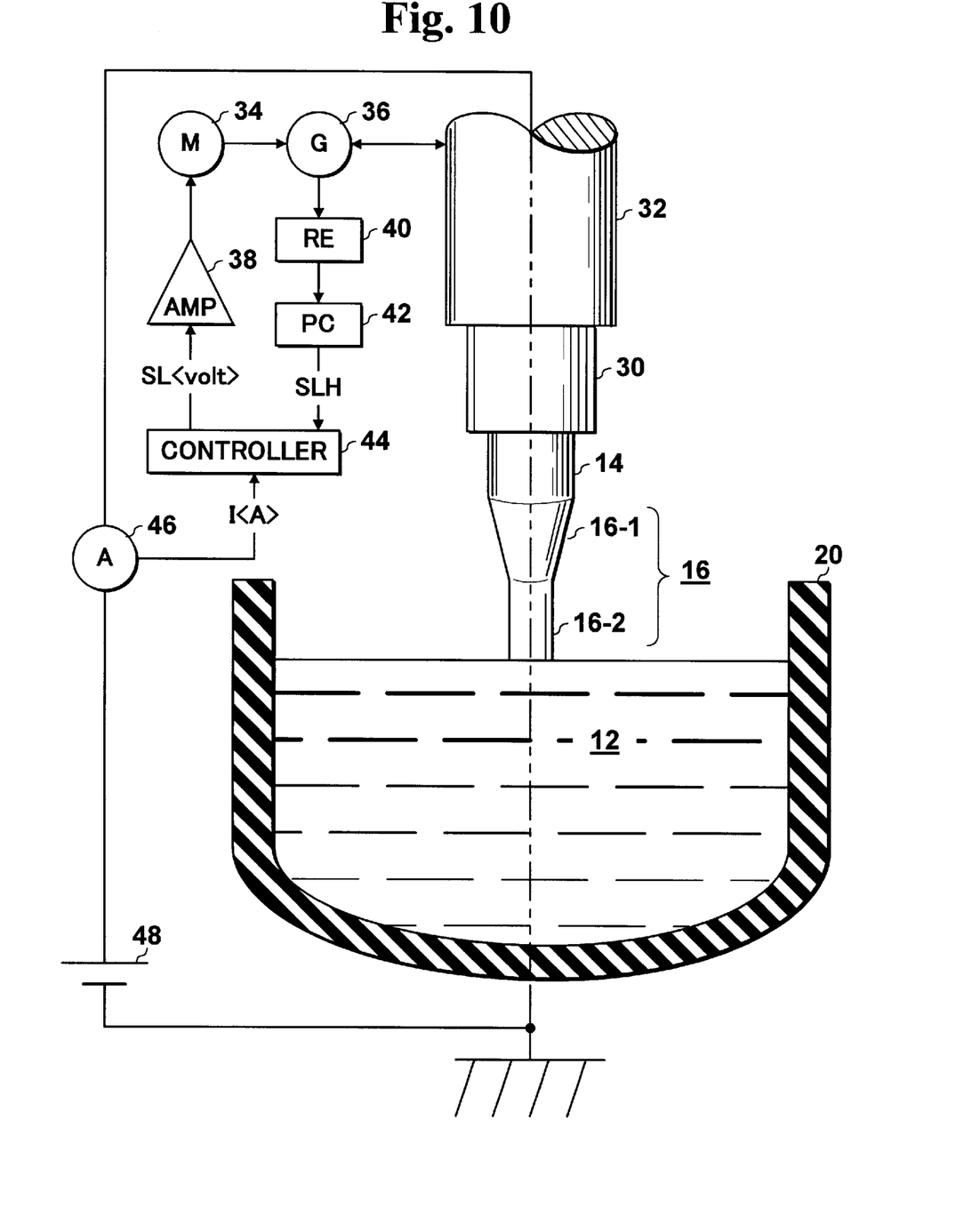
FIG. 10 is a partially sectional view which shows the construction of the apparatus for manufacturing a crystal in accordance with the preferred embodiment of the present invention.

FIG. 10 is a partially sectional view which shows the construction of the apparatus for manufacturing a crystal in accordance with the preferred embodiment of the present invention. Hereafter, the construction of this apparatus is explained based on this figure.

The controller 44 is a unit which controls the lifting action and the lowering action of the seed axis 32. When this controller 44 outputs the SL signal to the motor amplifier 38, the motor amplifier 38 amplifies this SL signal to rotates the motor 34. Then, the gear 36 connected with the motor 34 rotates, as a result the seed axis 32 connected with the gear 36 rises or lowers.

The rotation of the gear 36 is detected by the rotary encoder 40 and the pulse counter 42, and is input to the controller 44 as the SLH signal which shows the lifted height of the seed. The controller 44 knows the position of the seed 14 based on this SLH signal. The controller 44 is connected with the ammeter 46, and detects the generation of the breaking based on the values of the ammeter 46.

The ammeter 46 is arranged on the electric circuit constructed by the DC power supply 48 connected with both ends of the seed axis 32 and the crucible 20, and outputs the values of the current which flows in the circuit to the controller 44. Here, if the neck 16 and the melt 12 are connected to each other, the current flows on the virtual line shown by using the alternate long and two short dashes line in this figure, and the ammeter 46 outputs the value I of this current to the controller 44. On the other hand, when the breaking is caused and the neck 16 is separated from the melt 12, the flow of the current stops, and the current value I becomes 0.

Figure 11:
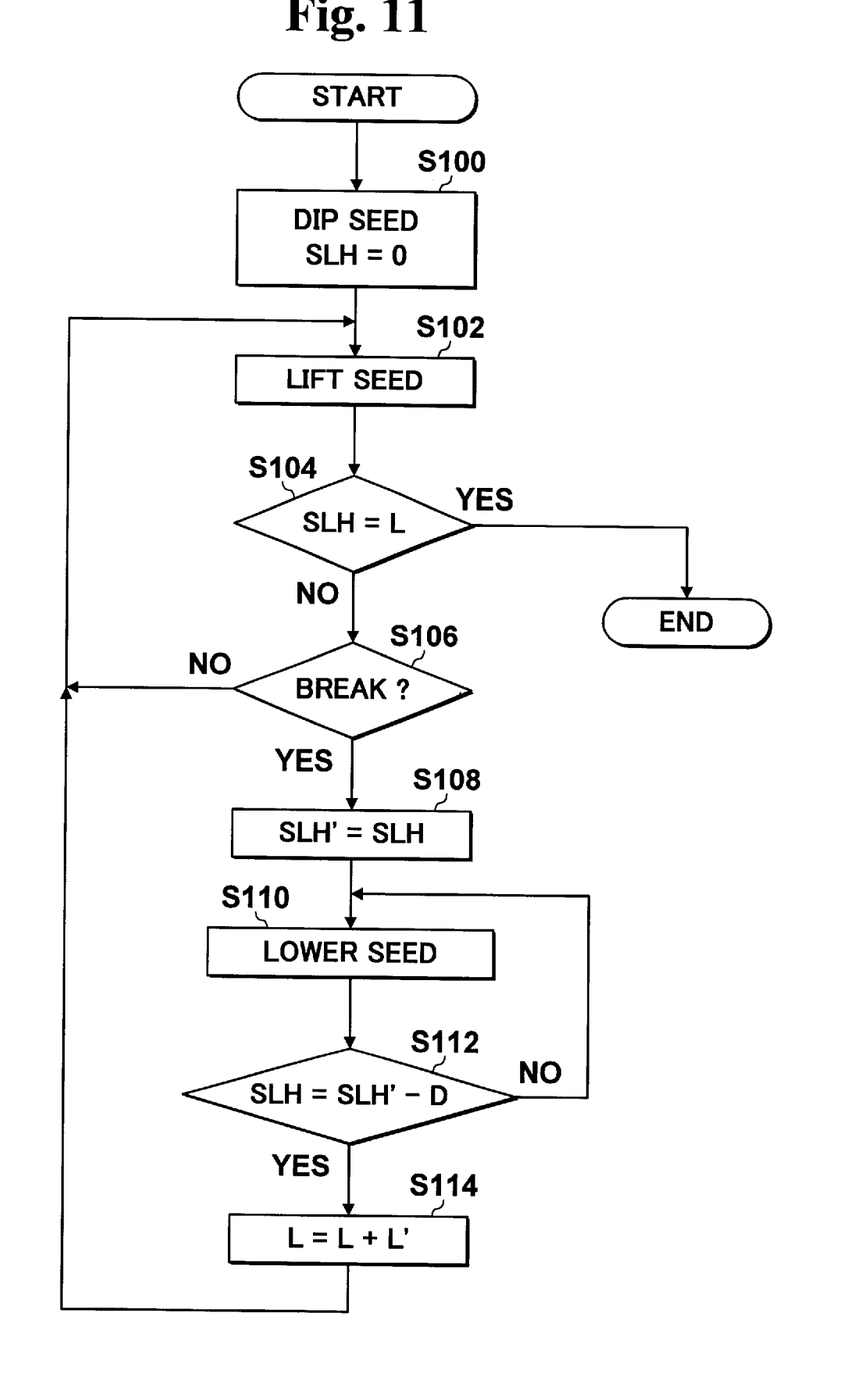
FIG. 11 is a flow chart which shows the necking procedure performed by the apparatus of FIG. 10.

FIG. 11 is a flow chart which shows the necking procedure performed by the apparatus of FIG. 10. Hereafter, an operation of the apparatus shown in FIG. 10 is explained based on FIG. 11.

First, the controller 44 lowers the seed axis 32 to dip the seed 14 on the surface of the melt 12, and sets the value of SLH at this time to 0 (step S100). The controller 44 lifts the seed 14 dipped on the melt 12 to start the necking (step S102).

The controller 44 judges whether the value of SLH from the pulse counter 42 has reached to the predetermined neck length L or not while the seed 14 is being lifted (step S104). At this time, if SLH has reached to the neck length L (YES in the step S104), the controller 44 judges that the removal of the dislocation is completed, and then stops the necking operation. On the other hand, the seed 14 is lifted continuously when SLH has not reached to the neck length L (NO in the step S104).

Next, the controller 44 examines that the value of the ammeter 46 becomes 0. As a result of this examination, if the value is not 0 (NO in the step S106) the controller 44 judges that the breaking has not occurred, and continues lifting operation of the seed in the step S102.

On the other hand, if the value of the ammeter 46 is 0 (YES in the step S106) the controller 44 judges that the breaking has occurred, and stores the value of SLH as the SLH' temporarily (step S108), afterwards lowers the seed 14 (step S110).

And then until the SLH value from the pulse counter 42 equals to the value of "SLH'-D", where D is a predetermined descending amount (NO in the step S112), the controller 44 lowers the seed 14 (step S110). That is, when the breaking occurs, the seed 14 is lowered by the predetermined descending amount D to dip the broken part on the melt.

After the seed 14 is lowered by the descending amount D (YES in the step S112), The controller 44 adds the predetermined length L' of the additional region 16-3 to the neck length L (step S114), and then continues the necking operation. As a result, the additional region 16-3 of length L' is formed beneath the broken part 18, the stability of the diameter and the elimination of the dislocation is achieved.

Figure 12:
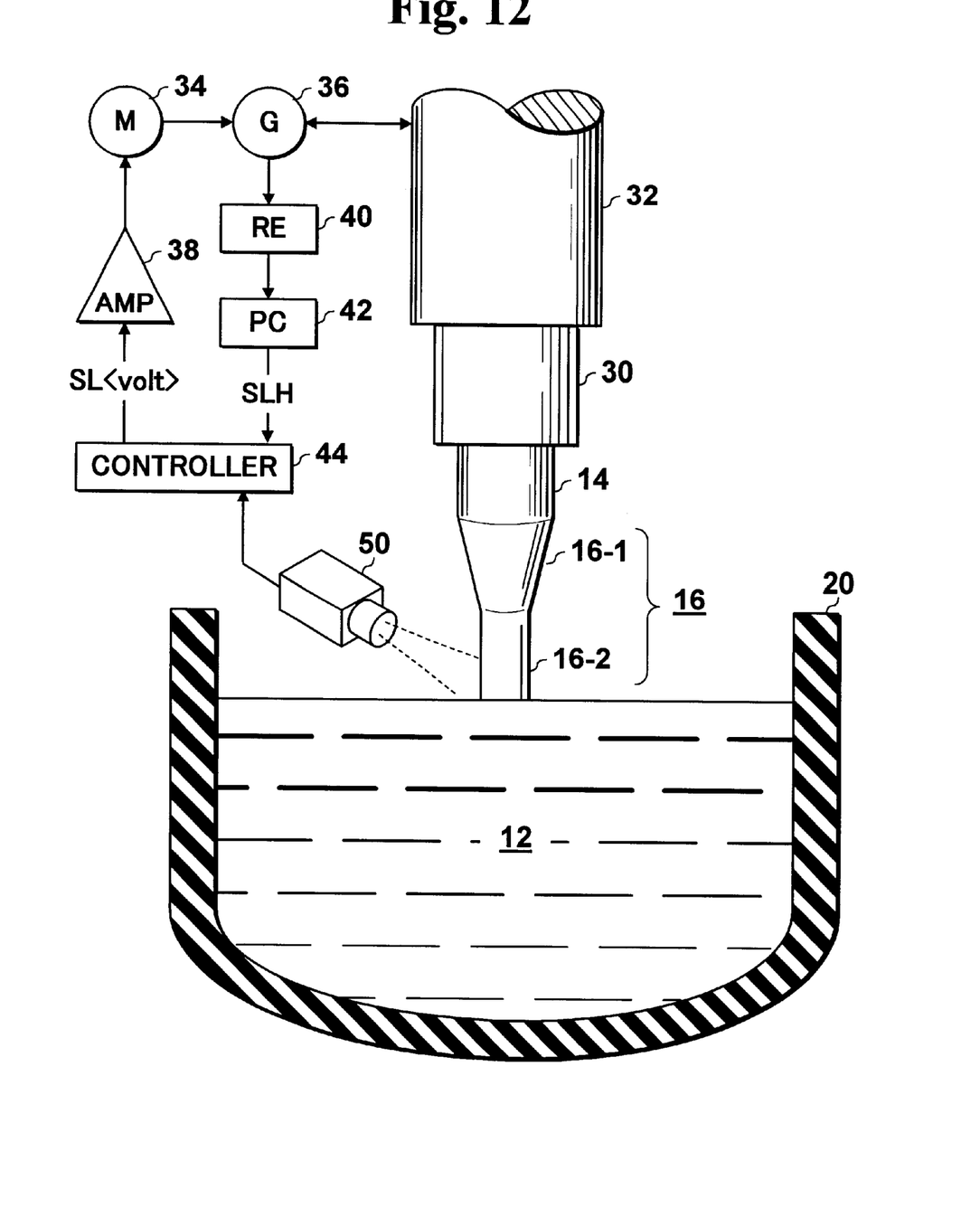
FIG. 12 is a partially sectional view which shows the construction of the another embodiment of the present invention.

FIG. 12 is a partially sectional view which shows the construction of the another embodiment of the present invention. As shown in this figure, the camera 50 may be disposed around the interface of the melt 12 to detect the breaking of the neck 16 by an optical method.

What is claimed is:

1. An apparatus for manufacturing a crystal wherein a lower end of a seed is dipped into a melt and the seed is subjected to lifting including a contraction process of forming a neck beneath a lower end of the seed so as to grow the crystal beneath the seed, comprising:

means for detecting that the neck grown beneath the lower end of the seed is physically separated into two pieces during the contraction process; and means for lowering the seed when it is detected that the neck is physically separated into two pieces so as to dip again a lower end of a piece of the neck that is attached to the seed into the melt, and then lifting the seed again.

2. An apparatus for manufacturing a crystal as claimed in claim 1, further comprising:

means for recognizing a separated position in the neck with respect to a desired contraction shape based on a shape of the piece of the neck that is attached to the seed when it is detected that the neck is physically separated into two pieces, and for determining whether the contraction process should be continued or a supplemental contraction process should be performed after the lower end of the piece of the neck attached to the seed is dipped again.

3. A method of manufacturing a crystal, wherein a lower end of a seed is dipped into a melt, and the seed is subjected to lifting including a contraction process so as to grow the crystal beneath the seed, comprising the steps of:

directly detecting that the neck grown beneath the lower end of the seed is physically separated into two pieces during the contraction process; and dipping again a lower end of a piece of the neck that is attached to the seed into the melt when it is detected that the neck is physically separated into two pieces, and then continuing the contraction process.

4. A method of manufacturing a crystal as claimed in claim 3, further comprising the steps of:

recognizing a separated position in the neck with respect to a desired contraction shape based on a shape of the piece of the neck that is attached to the seed; and lifting the seed after performing a supplemental contraction process in place of the contraction process when it is determined that dislocation is not generated by continuing the contraction process after the lower end of the piece of the neck attached to the seed is dipped again.

5. A method of manufacturing a crystal as claimed in claim 3, further comprising the steps of:

recognizing a separated position in the neck with respect to a desired contraction shape based on a shape of the piece of the neck that is attached to the seed; and lifting the seed while continuing the contraction process without performing a supplemental contraction process when it is determined that dislocation is generated by continuing the contraction process after the lower end of the piece of the neck attached to the seed is dipped again.

* * * * *